United States Patent
Lee et al.

(10) Patent No.: US 12,518,994 B2
(45) Date of Patent: Jan. 6, 2026

(54) TOWER LIFT AND SEMICONDUCTOR TRANSFER APPARATUS INCLUDING THE SAME

(71) Applicants: SEMES CO., LTD., Cheonan-si (KR); Daekhon International Inc., Seoul (KR)

(72) Inventors: Nahyun Lee, Ansan-si (KR); Myungjin Lee, Hwaseong-si (KR); Jongsuk Choi, Hwaseong-si (KR); Eunsang Yoon, Hwaseong-si (KR); Seungwhan Suh, Seoul-si (KR); Junghag Cha, Anyang-si (KR); Sungjin Lim, Ansan-si (KR); Jinkwan Heo, Gwangmyeong-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 101 days.

(21) Appl. No.: 18/528,362

(22) Filed: Dec. 4, 2023

(65) Prior Publication Data

US 2024/0213069 A1 Jun. 27, 2024

(30) Foreign Application Priority Data

Dec. 26, 2022 (KR) .................. 10-2022-0185011
Mar. 9, 2023 (KR) .................. 10-2023-0031086

(51) Int. Cl.
*B66B 1/06* (2006.01)
*B60L 13/03* (2006.01)
*B65G 49/06* (2006.01)
*H01L 21/677* (2006.01)

(52) U.S. Cl.
CPC ...... *H01L 21/67709* (2013.01); *B65G 49/061* (2013.01); *H01L 21/6773* (2013.01); *B65G 2201/0297* (2013.01)

(58) Field of Classification Search
CPC ........ H01L 21/67709; H01L 21/67178; H02K 41/0356; B65G 49/061; B66B 1/06; B60L 13/03
USPC ................................ 198/619; 104/290, 292
See application file for complete search history.

(56) References Cited

U.S. PATENT DOCUMENTS

| | | | | |
|---|---|---|---|---|
| 6,189,657 | B1* | 2/2001 | Jessenberger | H02K 41/031 187/289 |
| 9,906,112 | B2* | 2/2018 | Dwari | B66B 1/30 |
| 10,196,240 | B2* | 2/2019 | Piech | B66B 9/00 |
| 10,280,041 | B2* | 5/2019 | Rodriguez | H02K 41/031 |
| 11,691,851 | B2* | 7/2023 | Weinberger | B66B 11/0407 187/289 |
| 12,214,995 | B2* | 2/2025 | Illán | F16D 59/02 |
| 2016/0222957 | A1* | 8/2016 | Robison et al. | |
| 2021/0083614 | A1* | 3/2021 | Krug et al. | |

* cited by examiner

*Primary Examiner* — Douglas A Hess
(74) *Attorney, Agent, or Firm* — Harness, Dickey & Pierce, P.L.C.

(57) ABSTRACT

Provided is a tower lift including a frame extending in a vertical direction, a carriage configured to move along the frame, a first coil arranged on a first surface of the frame, the first surface facing the carriage, a second coil arranged on the first surface of the frame and separated from the first coil, a first magnet connected to the carriage and located between the first coil and the second coil, and a second magnet connected to the carriage, located between the first magnet and the second coil, and separated from the first magnet.

20 Claims, 9 Drawing Sheets

TOWER LIFT AND SEMICONDUCTOR TRANSFER APPARATUS INCLUDING THE SAME

CROSS-REFERENCE TO RELATED APPLICATIONS

This application is based on and claims priority under 35 U.S.C. § 119 to Korean Patent Application Nos. 10-2022-0185011, filed on Dec. 26, 2022, and 10-2023-0031086, filed on Mar. 9, 2023, in the Korean Intellectual Property Office, the disclosures of which are incorporated by reference herein in their entireties.

BACKGROUND

1. Field

The disclosure relates to a tower lift and a semiconductor transfer apparatus including the same, and more specifically, to a tower lift with no installation height restrictions and a semiconductor transfer apparatus including the tower lift.

2. Description of the Related Art

In general, a manufacturing line in a semiconductor or display manufacturing factory includes multiple layers. Pieces of equipment for performing processes such as deposition, exposure, etching, ion injection, cleaning, and the like may be respectively arranged on layers of a semiconductor transfer apparatus. The pieces of equipment respectively arranged on the layers may repetitively perform a series of unit processes on a semiconductor wafer used as a semiconductor substrate or a glass substrate used as a display substrate.

Article transfer, that is, transfer of articles such as the semiconductor wafer or the glass substrate, between the layers of the semiconductor transfer apparatus may be achieved by using a tower lift arranged in a vertical direction through the layers.

A general tower lift includes a carriage module for transferring an article and a rail module for guiding the carriage module in the vertical direction. A drive belt, such as a timing belt, for elevating the carriage module is arranged in the rail module. The timing belt is coupled to the carriage module to move the carriage module vertically.

SUMMARY

Provided are a tower lift with no installation height restrictions and a semiconductor transfer apparatus including the tower lift.

Provided are a tower lift and semiconductor transfer apparatus with fewer failures and defects due to suppressed physical deformation.

The objectives to be achieved by the technical spirit of the disclosure are not limited to those mentioned above, and other objectives may be clearly understood by one of ordinary skill in the art from the following descriptions.

Additional aspects will be set forth in part in the description which follows and, in part, will be apparent from the description, or may be learned by practice of the presented embodiments of the disclosure.

According to an aspect of the disclosure, a tower lift includes a frame extending in a vertical direction, a carriage configured to move along the frame, a first coil arranged on a first surface of the frame, the first surface facing the carriage, a second coil arranged on the first surface of the frame and separated from the first coil, a first magnet connected to the carriage and located between the first coil and the second coil, and a second magnet connected to the carriage, located between the first magnet and the second coil, and separated from the first magnet.

In an embodiment, the first coil may protrude from the frame in a direction toward the carriage, and the second coil may protrude in a direction parallel to the first coil.

In an embodiment, one surface of the first magnet may face a protruding portion of the first coil, and one surface of the second magnet may face a protruding portion of the second coil.

In an embodiment, the tower lift may further include a plurality of first coils and a plurality of second coils, wherein the plurality of first coils may be separated from each other, and the plurality of second coils may be separated from each other.

In an embodiment, the plurality of first coils may be arranged on the frame in a row along the frame to be separated from each other in the vertical direction, and the plurality of second coils may be arranged on the frame in a row along the frame to be separated from each other in the vertical direction.

In an embodiment, the first coil may include a first core located inside the first coil, and the second coil may include a second core located inside the second coil.

In an embodiment, the first core and the second core may each include a metal.

In an embodiment, the tower lift may further include a controller configured to control a current direction of the first coil and a current direction of the second coil.

In an embodiment, a direction of a magnetic field formed by the first magnet may be same as a direction of a magnetic field formed by the second magnet, and a direction of a current flowing in the first coil may be same as a direction of a current flowing in the second coil.

In an embodiment, a direction of a magnetic field formed by the first magnet may be different from a direction of a magnetic field formed by the second magnet, and a direction of a current flowing in the first coil may be opposite to a direction of a current flowing in the second coil.

In an embodiment, the first coil and the first magnet may be separated from each other in a horizontal direction, and the second coil and the second magnet may be separated from each other in the horizontal direction.

In an embodiment, a separation distance between the first magnet and the first coil may be same as a separation distance between the second magnet and the second coil.

In an embodiment, the first magnet and the first coil may be separated from each other by about 1 millimeter (mm) to about 5 mm, and the second magnet and the second coil may be separated from each other by about 1 mm to about 5 mm.

According to another aspect of the disclosure, a tower lift includes a rail module including a frame, a first coil, and a second coil, the frame extending in a vertical direction, and the first coil and the second coil being arranged on the frame, and a carriage module configured to move vertically along the rail module and including a first magnet and a second magnet, wherein the first coil and the second coil are arranged on a first surface of the frame and protrude from the rail module in a direction toward the carriage module, the first surface facing the carriage module, the first magnet is located between the first coil and the second coil, and the second magnet is located between the first magnet and the second coil.

In an embodiment, the rail module may further include a third coil, and the third coil may be arranged on the first surface of the frame and located between the first coil and the second coil.

In an embodiment, the third coil may include a portion protruding from the rail module in a direction toward the carriage module, and the protruding portion of the third coil may be located between the first magnet and the second magnet.

In an embodiment, the carriage module may further include a partition wall, and the partition wall may be located between the first magnet and the second magnet.

In an embodiment, the carriage module may further include a wheel, and the carriage module may come into contact with the frame and move along the rail module via the wheel.

In an embodiment, the tower lift may further include a plurality of carriage modules.

According to another aspect of the disclosure, a semiconductor transfer apparatus having a plurality of layers includes a tower lift configured to transport a container between the plurality of layers, a container storage arranged on each of the plurality of layers and configured to store the container, and a transport rail configured to connect the tower lift to the container storage and transport the container from the tower lift to the container storage, wherein the tower lift includes a rail module including a frame, a first coil, and a second coil, the frame extending in a vertical direction, and the first coil and the second coil being arranged on the frame, and a carriage module configured to move vertically along the rail module and including a carriage, a first magnet, and a second magnet, the carriage being configured to load the container, and the first magnet and the second magnet being arranged on the carriage, the first coil and the second coil are arranged on a first surface of the frame, the first surface facing the carriage, the first magnet is located between the first coil and the second coil, the second magnet is located between the first magnet and the second coil, and a separation distance between the first magnet and the first coil is same as a separation distance between the second magnet and the second coil.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
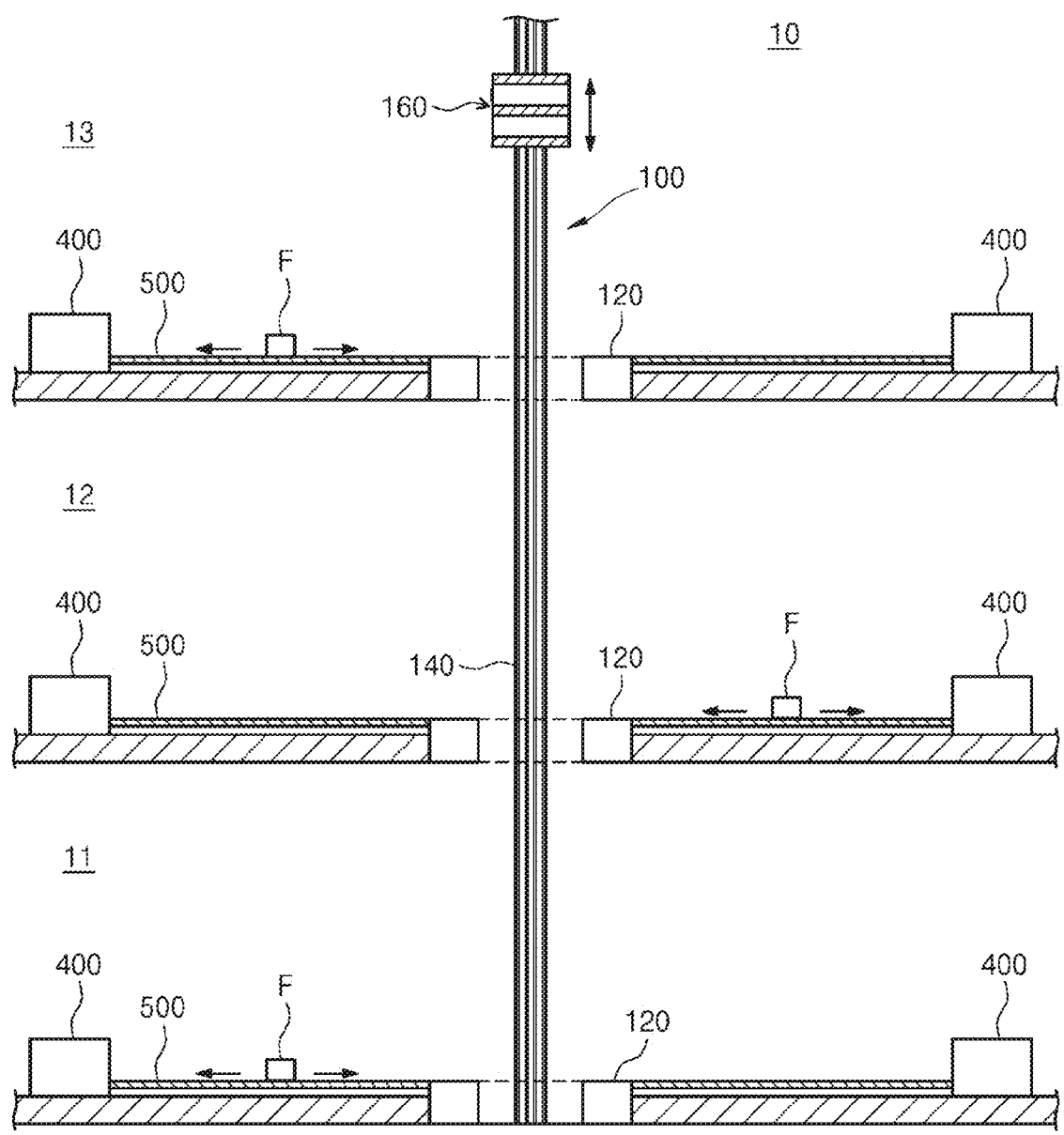
FIG. 1 is a schematic view of a semiconductor transfer apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Various modifications may be applied to the present embodiments, and some embodiments will be illustrated in the drawings and described in the detailed description. However, this does not limit the present embodiments within specific embodiments.

FIG. 1 is a schematic view of a semiconductor transfer apparatus 10 according to an embodiment.

Referring to FIG. 1, the semiconductor transfer apparatus 10 may have a multi-layer structure. For example, the semiconductor transfer apparatus 10 may have a first layer 11, a second layer 12, and a third layer 13. However, embodiments are not limited thereto, and the multi-layer structure of the semiconductor transfer apparatus 10 may be variously modified.

The semiconductor transfer apparatus 10 may be provided with a tower lift 100, a container storage 400, a transport rail 500, and semiconductor manufacturing devices (not shown) performing a semiconductor manufacturing process.

The tower lift 100 may transport a container F accommodating an article therein between the first, second, and third layers 11, 12, and 13 of the semiconductor transfer apparatus 10. The container storage 400 may be arranged on each of the first, second, and third layers 11, 12, and 13 of the semiconductor transfer apparatus 10 and store the container F. The transport rail 500 may connect the tower lift 100 to the container storage 400 and transport the container F transported by the tower lift 100 to the container storage 400.

The tower lift 100 may include a stage module 120, a rail module 140, and a carriage module 160.

The stage module 120 may be arranged on a bottom of each of the first, second, and third layers 11, 12, and 13 of the semiconductor transfer apparatus 10. The stage module 120 may be coupled to the transport rail 500 that transports the container F to the container storage 400. When the tower lift 100 transports the container F to each of the first, second, and third layers 11, 12, and 13, the container F transported to each of the first, second, and third layers 11, 12, and 13 May be transported to the container storage 400 by the transport rail 500.

The rail module 140 may extend in a vertical direction. The rail module 140 may extend in the vertical direction between at least two layers of the semiconductor transfer apparatus 10. The rail module 140 may guide movement of the carriage module 160 to be described below. Also, the rail module 140 may move, in the vertical direction, the carriage module 160 to be described below.

The carriage module 160 may be configured to be movable along the rail module 140. For example, the carriage module 160 may be configured to be movable in the vertical direction along the rail module 140. The carriage module 160 may have a carriage that transports an article. A plurality of carriage modules 160 may be provided. For example, the number of carriage modules 160 may be variously modified.

The carriage module 160 may have a seating shelf on which the container F accommodating an article therein is seated. Alternatively, the carriage module 160 may have a robot that holds the container F. The carriage module 160 may be modified to various structures capable of moving the container F.

Hereinafter, the rail module 140 and carriage module 160 according to an embodiment are described in detail.

Figure 2:
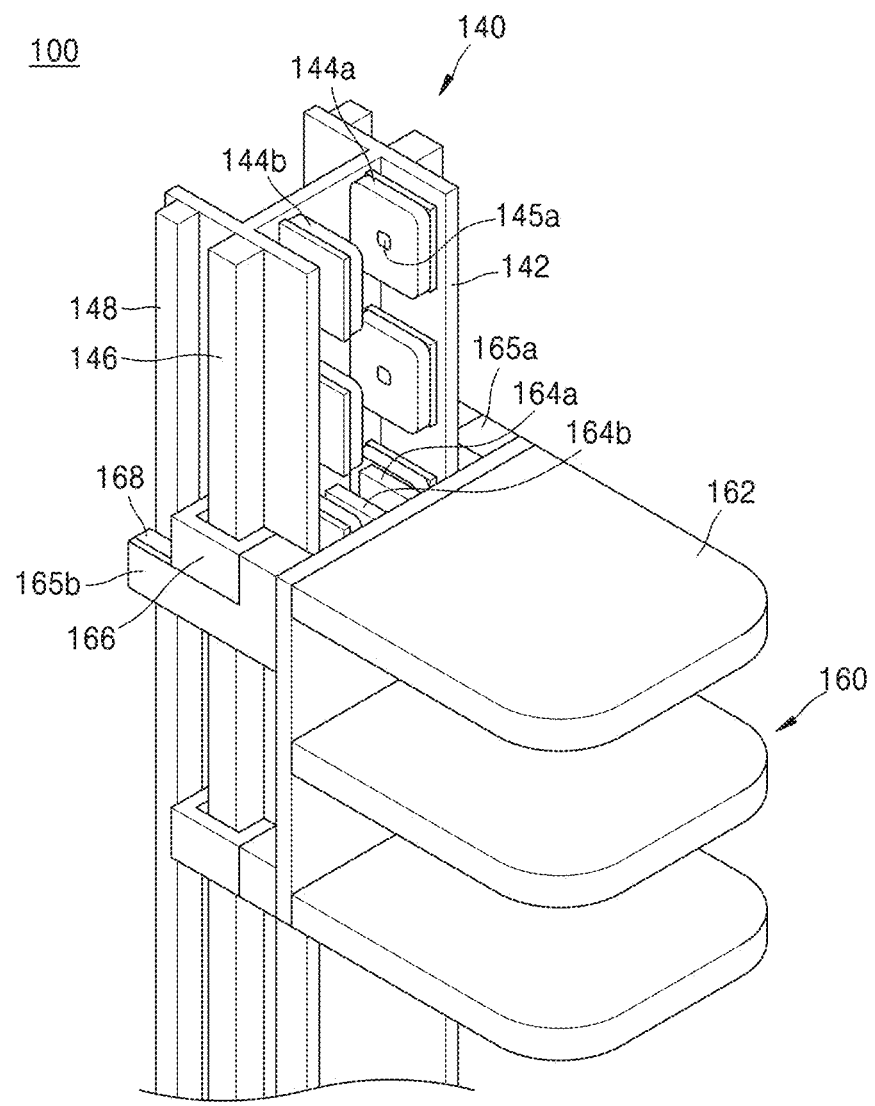
FIG. 2 is a schematic perspective view of a portion of a tower lift according to an embodiment.
Figure 3:
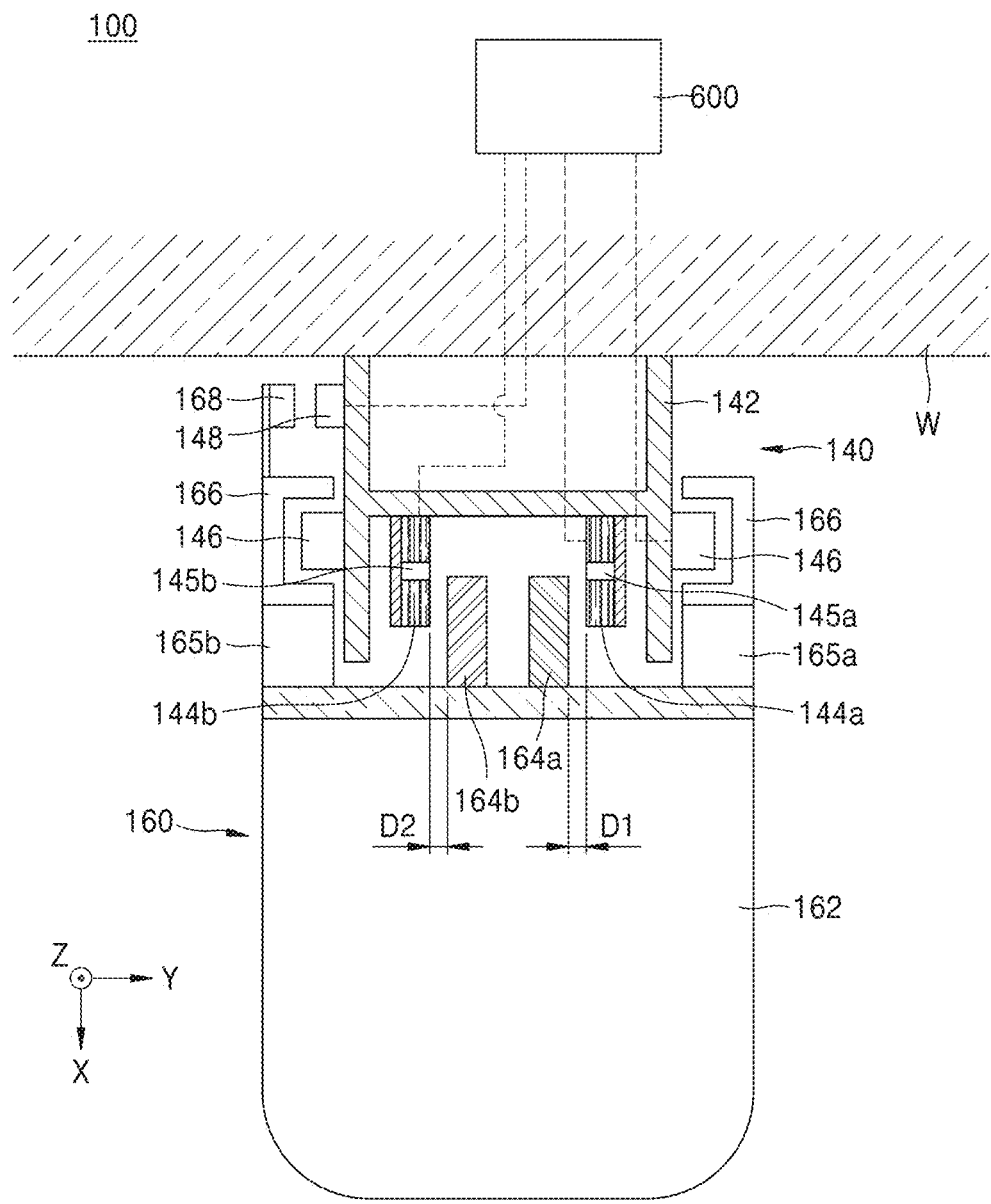
FIG. 3 is a schematic plan cross-sectional view of a tower lift according to an embodiment.

FIG. 2 is a schematic perspective view of a portion of the tower lift 100 according to an embodiment. FIG. 3 is a schematic plan cross-sectional view of the tower lift 100 according to an embodiment.

Referring to FIGS. 2 and 3, the tower lift 100 may include the rail module 140 and the carriage module 160.

The rail module 140 of the tower lift 100 may include a frame 142, a first coil 144a, a second coil 144b, a guide rail 146, and a power transmitter 148.

The frame 142 of the rail module 140 may extend in the vertical direction. That is, the frame 142 may extend from a bottom of semiconductor manufacturing equipment toward a ceiling. A longitudinal direction of the frame 142 may be the vertical direction. The frame 142 may be fixedly arranged on a wall W of the semiconductor manufacturing equipment.

The first coil 144a, the second coil 144b, the guide rail 146, and the power transmitter 148, which are described below, may be coupled to the frame 142. The frame 142 may have an H shape in a top view. However, embodiments are not limited thereto, and the shape of the frame 142 may be variously modified. In some embodiments, the frame 142 may have no height limitations. For example, the height of the frame 142 may be from about 1 meter (m) to about 1,000 m.

The first coil 144a of the rail module 140 may be arranged on the frame 142. In some embodiments, the first coil 144a may extend in the vertical direction. The first coil 144a may be arranged on a surface of the frame 142, which faces the carriage module 160 in a top view. The first coil 144a may protrude from one surface of the frame 142 in a direction toward the carriage module 160.

The second coil 144b of the rail module 140 may be arranged on the frame 142. The second coil 144b may be arranged on a surface of the frame 142, which faces the carriage module 160 in a top view. That is, the surface on which the second coil 144b is arranged on the frame 142 may be the same as the surface on which the first coil 144a is arranged on the frame 142. The second coil 144b may protrude from the frame 142 in a direction toward the carriage module 160.

The first coil 144a and the second coil 144b may be separated from each other in a horizontal direction. The first coil 144a and the second coil 144b may be separated from each other with a first magnet 164a and a second magnet 164b therebetween.

The first coil 144a and the second coil 144b may move a carriage 162 in the vertical direction through interaction with the first magnet 164a and the second magnet 164b. The interaction may be caused by a magnetic force generated by the first coil 144a and/or the first magnet 164a.

In some embodiments, a plurality of first coils 144a may be provided. The plurality of first coils 144a may be arranged on the frame 142 to be separated from each other in the vertical direction in which the frame 142 extends. That is, the plurality of first coils 144a may be arranged in a row along the frame 142 to be separated from each other.

Furthermore, a plurality of second coils 144b may be provided. The plurality of second coils 144b may be arranged on the frame 142 to be separated from each other in the vertical direction in which the frame 142 extends. That is, the plurality of second coils 144b may be arranged in a row along the frame 142 to be separated from each other.

The plurality of first coils 144a and the plurality of second coils 144b may be arranged on the frame 142 to face each other and be separated from each other in the horizontal direction. That is, a first row formed by the plurality of first coils 144a and a second row formed by the plurality of second coils 144b may be separated from each other. That is, the second row may be separated from the first row in the horizontal direction and extend in a direction parallel to the first row.

In some embodiments, the first coil 144a may further include a first core 145a. The first core 145a may be located inside the first coil 144a. In other words, the first core 145a may be located at a central portion of the first coil 144a. In some embodiments, a conductive wire may be wound around the first core 145a to form the first coil 144a.

In some embodiments, the second coil 144b may further include a second core 145b. The second core 145b may be located inside the second coil 144b. In other words, the second core 145b may be located at a central portion of the second coil 144b. In some embodiments, a conductive wire may be wound around the second core 145b to form the second coil 144b.

In some embodiments, the first core 145a and the second core 145b may each include a metal. In other words, the first and second cores 145a and 145b and the first and second magnets 164a and 164b may apply external forces to each other. In detail, the first and second magnets 164a and 164b may apply an attractive force formed by a magnetic field to the first and second cores 145a and 145b, and the first and second magnets 164a and 164b may receive a reaction force against the attractive force due to the first and second cores 145a and 145b, which are fixed. The external forces applied between the first and second cores 145a and 145b and the first and second magnets 164a and 164b are described below with reference to FIG. 4.

The guide rail 146 of the rail module 140 may constrain some of degrees of freedom of the carriage module 160. The guide rail 146 may constrain remaining degrees of freedom other than a degree of freedom of vertical-direction movement of the carriage module 160.

At least one guide rail 146 may be provided. For example, a plurality of guide rails 146 may be provided. Any one of the guide rails 146 may be arranged on one surface of the frame 142, and another one of the guide rails 146 may be arranged on the other surface of the frame 142.

For example, any one of the guide rails 146 may be arranged on one side wall of the frame 142, and another one of the guide rails 146 may be arranged on the other side wall of the frame 142. Also, a longitudinal direction of the guide rail 146 may be the same as a longitudinal direction of the frame 142.

In some embodiments, the guide rail 146 may be separated from a guide portion 166 of the carriage module 160, which is described below, by a repulsive force due to a magnetic force. Also, a gap sensor (not shown) may be provided to any one of the guide rail 146 and the guide portion 166, and the magnetic force may be controlled based on a measurement value measured by the gap sensor.

Accordingly, a gap between the guide rail 146 and the guide portion 166 may be controlled to be substantially constant.

The power transmitter 148 of the rail module 140 may transmit power to a power receiver 168 of the carriage module 160, which is described below. For example, the power transmitter 148 may be any one of non-contact power supply devices. The power transmitter 148 may be arranged on the frame 142.

The power transmitter 148 may be arranged on any one of surfaces of the frame 142, on which the guide rail 146 is arranged. For example, the power transmitter 148 may be arranged on one side wall among the surfaces of the frame 142, on which the guide rail 146 is arranged.

The carriage module 160 of the tower lift 100 may transport the container F accommodating an article therein. The carriage module 160 may be configured to be movable in the vertical direction along the rail module 140.

The carriage module 160 may move in the vertical direction along the rail module 140 to transport the container F accommodating an article therein to each of the first, second, and third layers 11, 12, and 13 of the semiconductor transfer apparatus 10.

The carriage module 160 may include the carriage 162, the first magnet 164a, the second magnet 164b, connection bodies 165a and 165b, the guide portion 166, and the power receiver 168.

The carriage 162 of the carriage module 160 may have a seating shelf shape on which the container F accommodating an article therein is seated. A robot (not shown) that holds the container F accommodating an article therein may be provided to the carriage 162. Although FIG. 2 shows that the carriage 162 has a three-stage shelf shape, embodiments are not limited thereto, and the shape of the carriage 162 may be variously modified.

The first magnet 164a and the second magnet 164b of the carriage module 160 may be arranged on the carriage 162. That is, the first magnet 164a and the second magnet 164b may be coupled to the carriage 162.

The first magnet 164a and the second magnet 164b may move the carriage 162 in the vertical direction through interaction with the first coil 144a and the second coil 144b described above. The interaction may be caused by a magnetic force generated by the first and second coils 144a and 144b and/or the first and second magnets 164a and 164b.

In detail, a Lorentz force may be applied to the carriage module 160 due to electric and magnetic forces generated by the first and second coils 144a and 144b and the first and second magnets 164a and 164b, respectively, so that the carriage module 160 may move in the vertical direction. This aspect is described below with reference to FIG. 4.

The first magnet 164a and the second magnet 164b may be separated from each other. The first magnet 164a and the second magnet 164b may be located between the first coil 144a and the second coil 144b. That is, the first coil 144a may be separated from the second coil 144b with the first magnet 164a and the second magnet 164b therebetween. In other words, the first magnet 164a and the second magnet 164b may be inserted between the first coil 144a and the second coil 144b.

In some embodiments, the first magnet 164a and the first coil 144a may be separated from each other. That is, while the carriage 162 moves, the first magnet 164a and the first coil 144a may not collide or come into contact with each other. In some embodiments, a separation distance between the first magnet 164a and the first coil 144a may be a first distance D1. The first distance D1 may be from about 1 millimeter (mm) to 5 about mm.

In some embodiments, the second magnet 164b and the second coil 144b may be separated from each other. That is, while the carriage 162 moves, the second magnet 164b and the second coil 144b may not collide or come into contact with each other. In some embodiments, a separation distance between the second magnet 164b and the second coil 144b may be a second distance D2. The second distance D2 may be from about 1 mm to about 5 mm.

Depending on a separation distance between the first and second magnets 164a and 164b and the first and second coils 144a and 144b, a Lorentz force acting on the carriage module 160 may vary. For example, as the distance between the first and second magnets 164a and 164b and the first and second coils 144a and 144b decreases, the Lorentz force acting on the carriage module 160 may increase. As the Lorentz force increases, the carriage module 160 may move at a higher speed.

In some embodiments, the first distance D1 and the second distance D2 may be substantially the same. In detail, a separation distance between the first core 145a located inside the first coil 144a and the first magnet 164a and a separation distance between the second core 145b located inside the second coil 144b and the second magnet 164b may be the same. In other words, the first and second magnets 164a and 164b and the first and second coils 144a and 144b may be located symmetrically with respect to the frame 142. For example, when the separation distance between the first magnet 164a and the first coil 144a is 2 mm, the separation distance between the second magnet 164b and the second coil 144b may be 2 mm.

Depending on the separation distance between the first and second coils 144a and 144b and the first and second magnets 164a and 164b, the magnitude of an external force acting between the first and second cores 145a and 145b located inside the first and second coils 144a and 144b and the first and second magnets 164a and 164b may also vary. The closer the first and second magnets 164a and 164b are to the first and second coils 144a and 144b, the greater the magnitude of an external force generated between the first and second magnets 164a and 164b and the first and second cores 145a and 145b may be.

Because the first distance D1 and the second distance D2 are substantially the same, the magnitude of an attractive force generated between the first core 145a and the first magnet 164a and the magnitude of an attractive force generated between the second core 145b and the second magnet 164b may be substantially the same. In addition, because the direction of an attractive force acting on the first core 145a and the direction of an attractive force acting on the second core 145b are opposite to each other, no net force may be applied to the frame 142 on which the first core 145a and the second core 145b are arranged. In other words, because attractive forces of the same magnitude in opposite directions are applied to the rail module 140, a net force actually applied to the rail module 140 may be substantially 0 Newton (N).

Furthermore, the magnitude of a reaction force acting on each of the first and second magnets 164a and 164b and the magnitude of an attractive force acting on each of the first and second cores 145a and 145b may be the same. In addition, the direction of a reaction force acting on the first magnet 164a and the direction of a reaction force acting on the second magnet 164b may be opposite to each other. Because the reaction forces acting on the first magnet 164a and the second magnet 164b have the same magnitude and opposite directions, no net force may be applied to the carriage module 160. In other words, because reaction forces of the same magnitude in opposite directions are applied to the carriage module 160, a net force actually applied to the carriage module 160 may be 0 N.

The connection bodies 165a and 165b of the carriage module 160 may couple the guide portion 166 and the power receiver 168, which are described below, to the carriage 162. The connection bodies 165a and 165b may include a first connection body 165a and a second connection body 165b.

The first connection body 165a and the second connection body 165b may have different shapes from each other. The second connection body 165b may couple the guide portion 166 and the power receiver 168 to the carriage 162. The first connection body 165a may couple the guide portion 166 to the carriage 162.

The guide portion 166 may be coupled to the carriage 162 by the connection bodies 165a and 165b. Accordingly, when the carriage 162 moves, the guide portion 166 may move with the carriage 162 in the vertical direction. The guide portion 166 may have a shape surrounding at least a portion of the guide rail 146 arranged on the frame 142. The guide portion 166 may have a U shape in a top view.

The guide rail 146 may be inserted into the guide portion 166. Accordingly, the guide portion 166 may constrain, together with the guide rail 146, remaining degrees of freedom other than a degree of freedom of vertical-direction movement of the carriage module 160.

In some embodiments, a gap sensor (not shown) may be provided to any one of the guide rail 146 and the guide portion 166, and the magnetic force may be controlled based on a measurement value measured by the gap sensor. Accordingly, a gap between the guide rail 146 and the guide portion 166 may be controlled to be substantially constant.

The power receiver 168 of the carriage module 160 may receive power transmitted from the power transmitter 148. Also, the power receiver 168 may be arranged to face the power transmitter 148. The power receiver 168 may be any one of non-contact power supply devices.

The power receiver 168 may be coupled to the carriage 162 via the second connection body 165b. Accordingly, when the carriage 162 moves, the power receiver 168 may move with the carriage 162 in the vertical direction.

The carriage module 160 may include the power receiver 168 and receive power from the power transmitter 148 in a non-contact manner. That is, power necessary for driving the carriage module 160 may be received in a non-contact manner.

According to the disclosure, the first coil 144a and the second coil 144b may be arranged on the frame 142 to be symmetrical and separated from each other with respect to the first magnet 164a and the second magnet 164b. The first and second coils 144a and 144b, which are a pair of core-type coils respectively including the first and second cores 145a and 145b therein, may be arranged symmetrically with respect to the first and second magnets 164a and 164b, so that external forces applied to the rail module 140 may have the same magnitude and only have opposite directions.

Accordingly, a net force of the rail module 140 may be 0 N. That is, because the sum of external forces generated in the rail module 140 is 0 N, physical deformation of the rail module 140 due to an external force may be suppressed.

Also, according to the disclosure, the first and second coils 144a and 144b that require a power line connected thereto may be arranged on the frame 142, and the carriage module 160 may include the first and second magnets 164a and 164b that do not require a power line connected thereto. That is, all interface lines, such as a power line, may be connected to components included in the rail module 140, and no interface lines may be connected to the carriage module 160.

When interface lines are connected to the carriage module 160, the connected interface lines may act as elements interrupting an operation of a plurality of carriage modules 160. However, because no interface lines are connected to the carriage module 160 according to an embodiment, an operation of the plurality of carriage modules 160 may be facilitated.

Figure 4:
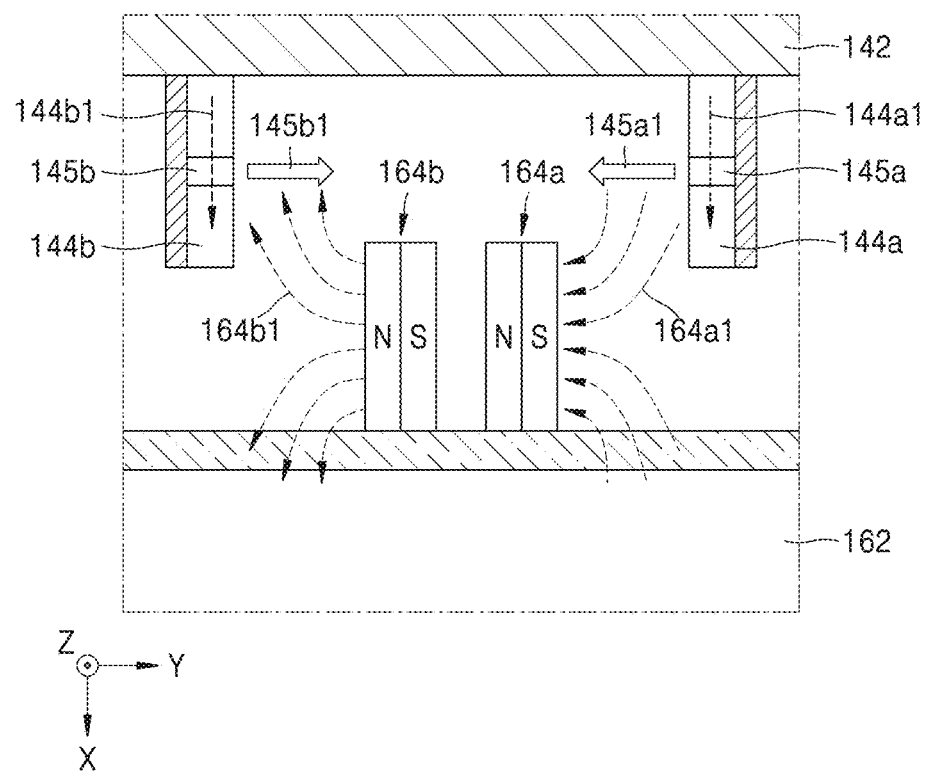
FIG. 4 is a plan cross-sectional view for illustrating a method of driving a tower lift, according to an embodiment.
Figure 5:
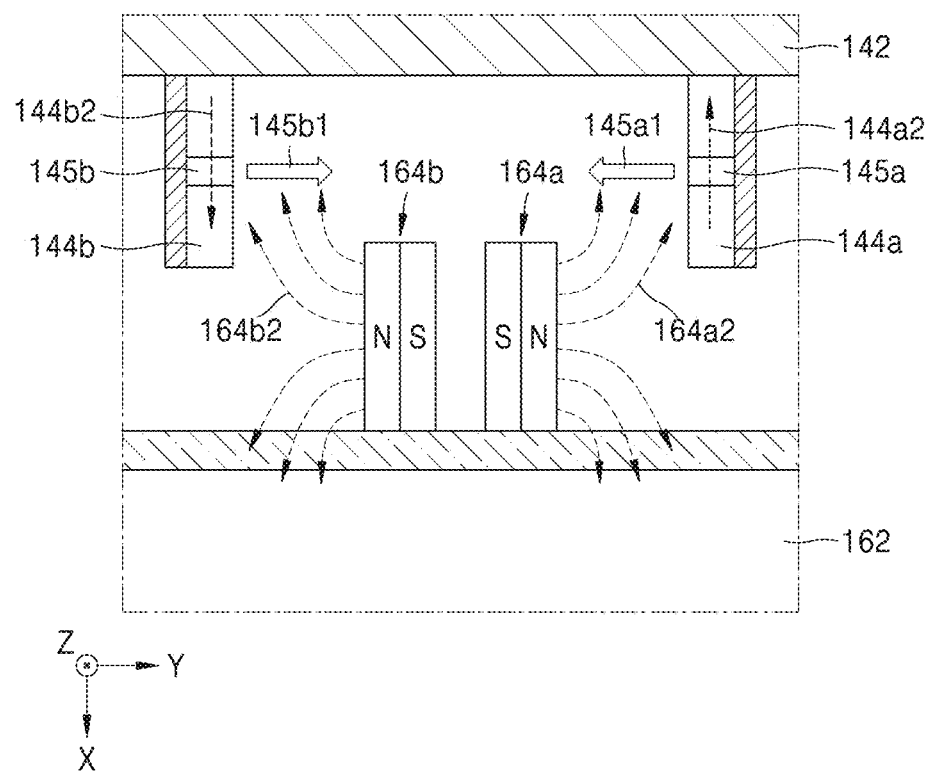
FIG. 5 is a plan cross-sectional view for illustrating a method of driving a tower lift, according to an embodiment.

FIG. 4 is a plan cross-sectional view for illustrating a method of driving the tower lift 100, according to an embodiment. FIG. 5 is a plan cross-sectional view for illustrating a method of driving the tower lift 100, according to an embodiment.

Referring to FIGS. 3 to 5, current directions of the first and second coils 144a and 144b and magnetic field directions of the first and second magnets 164a and 164b are described in detail. FIGS. 4 and 5 show enlarged views of the first coil 144a, the second coil 144b, the first magnet 164a, and the second magnet 164b of FIG. 3.

A Lorentz force refers to a force that electrons receive in a magnetic field. The direction of a Lorentz force may be calculated according to Fleming's left hand rule. Hereinafter, because the first and second coils 144a and 144b, through which electrons flow, are fixed to the frame 142 and the first and second magnets 164a and 164b, which form a magnetic field, are included in the carriage module 160 to move, a reaction force received by the first and second magnets 164a and 164b is also considered and described as a Lorentz force.

The tower lift 100 may further include a controller 600. The controller 600 may provide power to the first coil 144a and the second coil 144b. Furthermore, the controller 600 may adjust the current direction of the first coil 144a and the current direction of the second coil 144b. That is, the controller 600 may adjust the direction of a Lorentz force applied to the carriage module 160 by adjusting the current direction of the first coil 144a and the current direction of the second coil 144b, thereby raising or lowering the carriage module 160.

Hereinafter, an example in which, when the carriage module 160 is lowered, the controller 600 controls the first coil 144a and the second coil 144b according to the magnetic field directions of the first and second magnets 164a and 164b is described with reference to FIGS. 4 and 5.

As shown in FIG. 4, when a magnetic field direction 164a1 of the first magnet 164a and a magnetic field direction 164b1 of the second magnet 164b are the same, the controller 600 may adjust the current direction of the first coil 144a and the current direction of the second coil 144b to be the same direction. In other words, when different poles of the first magnet 164a and the second magnet 164b face each other, for example, when an N pole of the first magnet 164a and an S pole of the second magnet 164b face each other, the controller 600 may adjust the current direction of the first coil 144a and the current direction of the second coil 144b to be the same direction.

For example, when the magnetic field direction 164a1 of the first magnet 164a and the magnetic field direction 164b1 of the second magnet 164b are the same, the direction of a current flowing in the first coil 144a may be a first direction 144a1, and the direction of a current flowing in the second coil 144b may be a second direction 144b1. The first direction 144a1 and the second direction 144b1 may be the same. When the first direction 144a1 is a clockwise direction rotating about the first core 145a, the second direction 144b1 may be a clockwise direction rotating about the second core 145b.

As shown in FIG. 5, when a magnetic field direction 164a2 of the first magnet 164a and a magnetic field direction 164b2 of the second magnet 164b are opposite to each other, the controller 600 may adjust the current direction of the first coil 144a and the current direction of the second coil 144b to be different directions. In other words, when the same poles of the first magnet 164a and the second magnet 164b face each other, for example, when an S pole of the first magnet 164a and an S pole of the second magnet 164b face each other, the controller 600 may adjust the current direction of the first coil 144a and the current direction of the second coil 144b to be different directions.

For example, when the magnetic field direction 164a2 of the first magnet 164a and the magnetic field direction 164b2 of the second magnet 164b are different from each other, the direction of a current flowing in the first coil 144a may be a third direction 144a2, and the direction of a current flowing in the second coil 144b may be a fourth direction 144b2. The third direction 144a2 and the fourth direction 144b2 may be different from each other. When the third direction 144a2 is a clockwise direction rotating about the first core 145a, the fourth direction 144b2 may be a counterclockwise direction rotating about the second core 145b.

Hereinafter, a net force of external forces applied to the rail module 140, that is, a first attractive force 145a1 and a second attractive force 145b1 which are applied to the first core 145a and the second core 145b, is described.

The first attractive force 145a1 applied to the first core 145a may have the same magnitude as that of the second attractive force 145b1 applied to the second core 145b. In other words, because the distance between the first core 145a and the first magnet 164a and the distance between the second core 145b and the second magnet 164b are substantially the same, the first attractive force 145a1 and the second attractive force 145b1 may be the same.

The direction of the first attractive force 145a1 and the direction of the second attractive force 145b1 may be independent of the magnetic field directions 164a1 and 164a2 of the first magnet 164a and the magnetic field directions 164b1 and 164b2 of the second magnet 164b. That is, regardless of the magnetic field directions of the first and second magnets 164a and 164b, the direction of the first attractive force 145a1 may be a direction from the first core 145a toward the first magnet 164a, and the direction of the second attractive force 145b1 may be a direction from the second core 145b toward the second magnet 164b. In other words, the direction of the first attractive force 145a1 and the direction of the second attractive force 145b1 may always be opposite directions. Accordingly, the sum of external forces applied to the frame 142 on which the first core 145a and the second core 145b are arranged may be substantially 0 N at any time.

According to the disclosure, the controller 600 may adjust the current direction of the first coil 144a and the current direction of the second coil 144b such that the direction of a Lorentz force generated between the first coil 144a and the first magnet 164a and the direction of a Lorentz force generated between the second coil 144b and the second magnet 164b may be the same.

In some embodiments, the controller 600 may control the tower lift 100. The controller 600 may control the tower lift 100 such that the carriage module 160 may move along the rail module 140 in a magnetic levitation manner.

Also, the controller 600 may include a process controller including a microprocessor (computer) that executes control of the tower lift 100, a keyboard by which an operator performs a command input operation or the like to manage the tower lift 100, and a user interface that visually displays an operation status of the tower lift 100.

The controller 600 may include a memory storing a control program for executing processing performed in the tower lift 100 under control by the process controller or a program for executing processing in each component according to various data and processing conditions, that is, a processing recipe.

Also, the user interface and the memory may be connected to the process controller. The processing recipe may be stored in a storage medium of the memory, and the storage medium may be a hard disk, a transportable disc, such as CD-ROM or DVD, or a semiconductor memory, such as flash memory.

Figure 6:
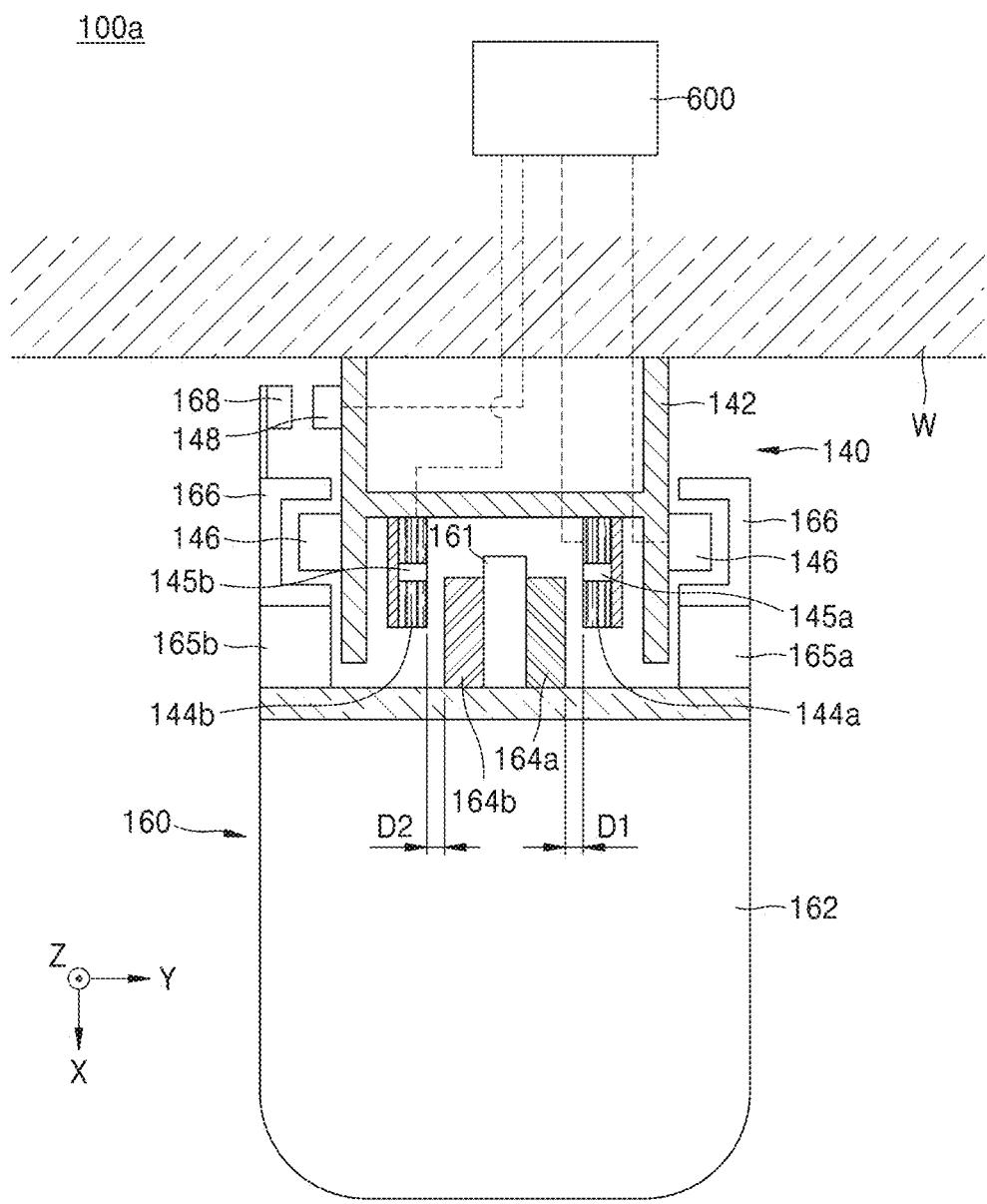
FIG. 6 is a schematic plan cross-sectional view of a tower lift according to an embodiment.

FIG. 6 is a schematic plan cross-sectional view of a tower lift 100a according to an embodiment.

Referring to FIG. 6, the tower lift 100a may include the rail module 140 and the carriage module 160. Hereinafter, overlapping descriptions between the tower lift 100a of FIG. 6 and the tower lift 100 of FIG. 3 are omitted, and differences therebetween are described.

The carriage module 160 of the tower lift 100a may further include a partition wall 161. In some embodiments, the partition wall 161 may block at least a portion of a magnetic field between the first magnet 164a and the second magnet 164b. For example, the partition wall 161 may include a material with high magnetic permeability, such as a metal. In some embodiments, the partition wall 161 may include the same material as that of the frame 142. For example, the partition wall 161 may include aluminum.

In some embodiments, the partition wall 161 may be located between the first magnet 164a and the second magnet 164b. That is, the first magnet 164a may be separated from the second magnet 164b with the partition wall 161 therebetween.

The partition wall 161 may be attached to the carriage 162. In other words, the partition wall 161 may have a shape protruding from the carriage 162. That is, the partition wall 161 may have a shape protruding from the carriage 162 toward the frame 142. The direction in which the partition wall 161 protrudes may be the same as the direction in which the first magnet 164a and the second magnet 164b protrude. That is, the partition wall 161 may protrude parallel to the first magnet 164a and the second magnet 164b.

In some embodiments, the partition wall 161 may be in contact with the first magnet 164a and the second magnet 164b. In detail, the partition wall 161 may include a metal material so that the first magnet 164a and the second magnet 164b may be attached to the partition wall 161. When the first magnet 164a and the second magnet 164b are attached to the partition wall 161, the strength of a magnetic field may increase on surfaces of the first magnet 164a and the second magnet 164b, which are not attached to the partition wall 161. Accordingly, a Lorentz force generated between the first magnet 164a and the first coil 144a and a Lorentz force generated between the second magnet 164b and the second coil 144b may increase.

In some embodiments, the first magnet 164a and the second magnet 164b may be fixed to the partition wall 161 via an adhesive material. That is, the partition wall 161 may include a non-metallic material and thus may not generate an attractive force with the first magnet 164a and the second magnet 164b, so that the first magnet 164a and the second magnet 164b may be fixed to the partition wall 161 via an adhesive material.

Figure 7:
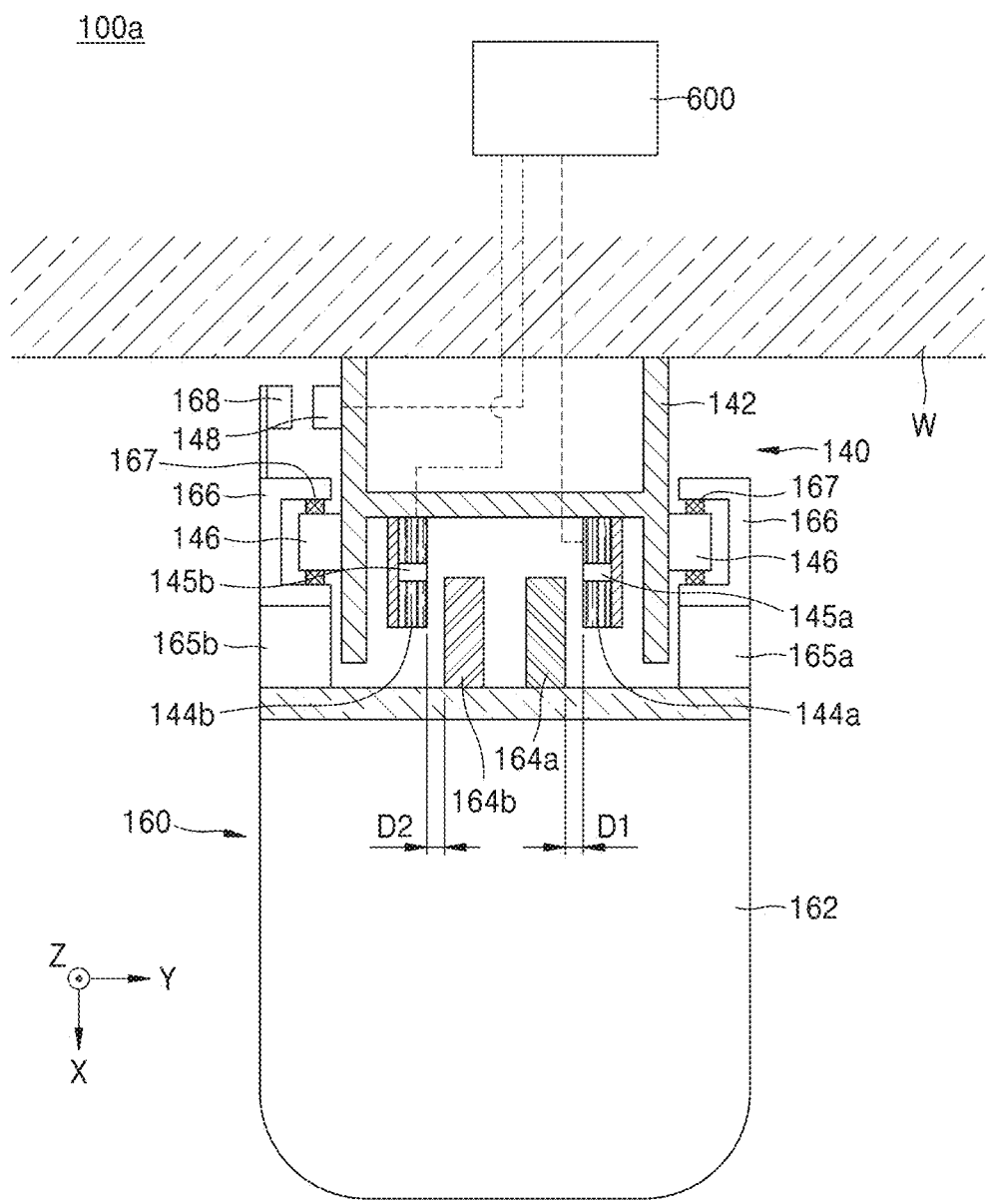
FIG. 7 is a schematic plan cross-sectional view of a tower lift according to an embodiment.

FIG. 7 is a schematic plan cross-sectional view of a tower lift 100b according to an embodiment.

Referring to FIG. 7, the tower lift 100b may include the rail module 140 and the carriage module 160. Hereinafter, overlapping descriptions between the tower lift 100b of FIG. 7 and the tower lift 100 of FIG. 3 are omitted, and differences therebetween are described.

The carriage module 160 of the tower lift 100b may further include a wheel 167. In other words, the carriage module 160 may come into contact with the rail module 140 and move along the rail module 140. The wheel 167 may be arranged on the guide portion 166. In detail, the wheel 167 may be arranged inside the guide portion 166 to be in contact with the guide rail 146.

The wheel 167 may be attached to the guide portion 166 and may move with the carriage module 160. When the carriage module 160 moves by a Lorentz force, the wheel 167 may come into contact with the guide rail 146 and rotate.

In some embodiments, the wheel 167 may be arranged on a side surface of the guide portion 166, which faces the guide rail 146. Although FIG. 7 shows that four wheels 167 are attached to side surfaces of the guide portion 166, embodiments are not limited thereto, and various numbers of wheels 167 may be arranged on the side surfaces of the guide portion 166.

In the case of the carriage module 160 that moves in a contact manner, a distance between the guide portion 166 and the guide rail 146 may be maintained constant via the wheel 167, without the action of an external force. That is, a separation distance between the guide portion 166 and the guide rail 146 may be maintained constant via the wheel 167. That is, the guide portion 166 and the guide rail 146 may be prevented from colliding with each other.

Figure 8:
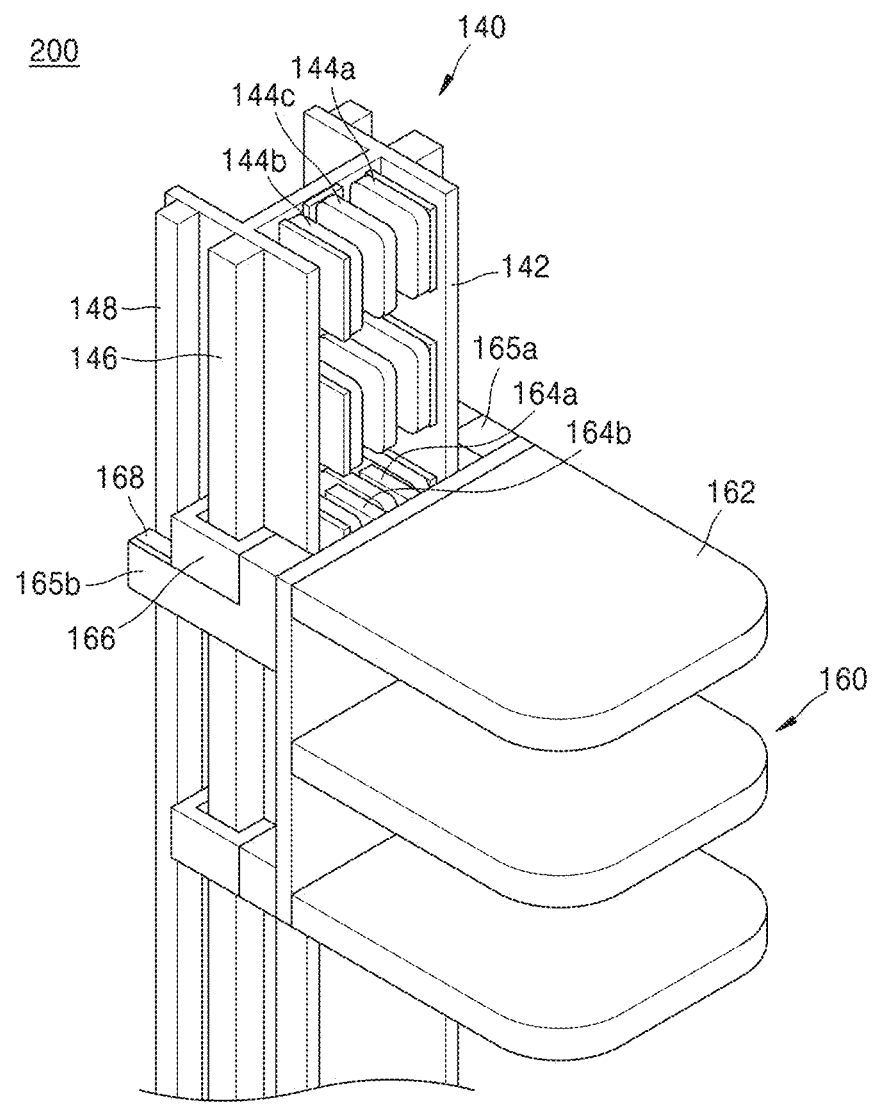
FIG. 8 is a schematic perspective view of a portion of a tower lift according to an embodiment.
Figure 9:
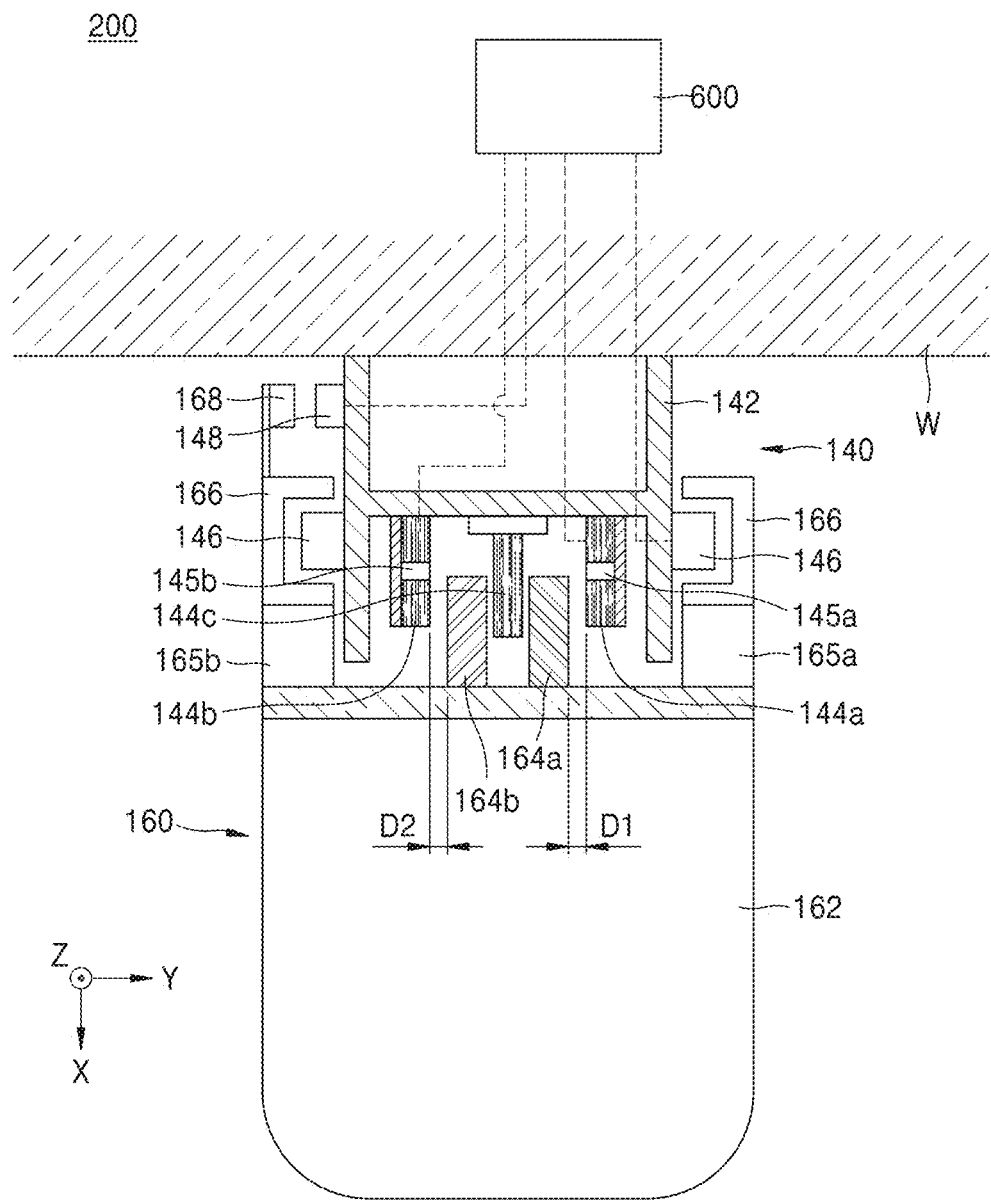
FIG. 9 is a schematic plan cross-sectional view of a tower lift according to an embodiment.

FIG. 8 is a schematic perspective view of a portion of a tower lift 200 according to an embodiment. FIG. 9 is a schematic plan cross-sectional view of the tower lift 200 according to an embodiment.

Referring to FIGS. 8 and 9, the tower lift 200 may include the rail module 140 and the carriage module 160.

The rail module 140 of the tower lift 200 may include the frame 142, the first coil 144a, the second coil 144b, a third coil 144c, the guide rail 146, and the power transmitter 148. The carriage module 160 may include the carriage 162, the first magnet 164a, the second magnet 164b, the connection bodies 165a and 165b, the guide portion 166, and the power receiver 168.

Hereinafter, overlapping descriptions between the tower lift 200 of FIG. 8 and the tower lift 100 of FIG. 3 are omitted, and differences therebetween are described.

The rail module 140 of the tower lift 200 may include the first coil 144a, the second coil 144b, and the third coil 144c.

The first coil 144a, the second coil 144b, and the third coil 144c may be arranged on the frame 142 to be separated from each other in the horizontal direction. The third coil 144c may be located between the first coil 144a and the second coil 144b. That is, the first coil 144a may face one end of the third coil 144c, and the second coil 144b may face the other end of the third coil 144c.

In some embodiments, the third coil 144c may move the carriage 162 in the vertical direction through interaction with the first magnet 164a and the second magnet 164b. The interaction may be a Lorentz force formed by a magnetic force generated by the third coil 144c, the first magnet 164a, and the second magnet 164b.

The third coil 144c may be arranged on a surface of the frame 142, which faces the carriage module 160 in a top view. That is, the third coil 144c may be arranged on the same surface of the frame 142, on which the first coil 144a and the second coil 144b are arranged.

In some embodiments, the first coil 144a and the second coil 144b may respectively include the first core 145a and the second core 145b therein. That is, the first coil 144a and the second coil 144b may each be a core-type coil including an iron core therein. In other words, the first coil 144a and the second coil 144b may each be a portion of a core-type linear motor. The third coil 144c may not include a core therein. That is, the third coil 144c may be a coreless-type coil without an iron core therein. In other words, the third coil 144c may be a portion of a coreless-type linear motor.

For example, the first coil 144a and the second coil 144b may receive an attractive force due to the cores located therein and the first magnet 164a and the second magnet 164b, and the third coil 144c, due to the absence of a core therein, may not receive an attractive force caused by the first magnet 164a and the second magnet 164b.

Although FIGS. 8 and 9 show a case in which the third coil 144c is a coreless-type coil, embodiments are not limited thereto, and the third coil 144c may be a core-type coil. However, when the third coil 144c is a core-type coil, a separation distance between the third coil 144c and the first magnet 164a and a separation distance between the third coil 144c and the second magnet 164b may be substantially the same.

The carriage module 160 of the tower lift 200 may include the first magnet 164a and the second magnet 164b.

The first magnet 164a may be located between the first coil 144a and the third coil 144c, and the second magnet 164b may be located between the third coil 144c and the second coil 144b. In other words, in a top view of the tower lift 200, the first coil 144a, the first magnet 164a, the third coil 144c, the second magnet 164b, and the second coil 144b may be arranged sequentially.

In some embodiments, the first magnet 164a may be separated from the first coil 144a and the third coil 144c, and the second magnet 164b may be separated from the second coil 144b and the third coil 144c. That is, while the first magnet 164a and the second magnet 164b are arranged on the carriage 162 and move with the carriage 162, the first magnet 164a and the second magnet 164b may not collide with the first coil 144a, the second coil 144b, and the third coil 144c.

When the separation distance between the first magnet 164a and the first coil 144a is the first distance D1 and the separation distance between the second magnet 164b and the second coil 144b is the second distance D2, the first distance D1 and the second distance D2 may be substantially the same. Because the first distance D1 and the second distance D2 are the same, the magnitude of an external force generated between the first core 145a and the first magnet 164a and the magnitude of an external force generated between the second core 145b and the second magnet 164b may be the same.

In some embodiments, the first magnet 164a and the first coil 144a may each be a portion of a core-type linear motor, and the second magnet 164b and the second coil 144b may each be a portion of a core-type linear motor. The third coil 144c having no core therein, the first magnet 164a, and the second magnet 164b may each be a portion of a coreless linear motor.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A tower lift comprising:
a frame extending in a vertical direction;
a carriage module configured to move along the frame, the carriage module comprising a plurality of carriages spaced apart from each other in the vertical direction, the plurality of carriages each comprising a seating shelf having a surface perpendicular to the vertical direction and configured to seat an article;
a first coil arranged on a first surface of the frame, the first surface facing the carriage module;
a second coil arranged on the first surface of the frame and separated from the first coil;
a first magnet connected to the carriage module and located between the first coil and the second coil; and
a second magnet connected to the carriage module, located between the first magnet and the second coil, and separated from the first magnet.

2. The tower lift of claim 1, wherein
the first coil protrudes from the frame in a direction toward the carriage module, and
the second coil protrudes in a direction parallel to the first coil.

3. The tower lift of claim 2, wherein
one surface of the first magnet faces a protruding portion of the first coil, and
one surface of the second magnet faces a protruding portion of the second coil.

4. The tower lift of claim 1, further comprising:
a plurality of first coils; and
a plurality of second coils,
wherein the plurality of first coils are separated from each other, and
the plurality of second coils are separated from each other.

5. The tower lift of claim 4, wherein
the plurality of first coils are arranged on the frame in a first row along the frame to be separated from each other in the vertical direction, and
the plurality of second coils are arranged on the frame in a second row along the frame to be separated from each other in the vertical direction.

6. The tower lift of claim 1, wherein
the first coil comprises a first core located inside the first coil, and
the second coil comprises a second core located inside the second coil.

7. The tower lift of claim 6, wherein
the first core comprises a first metal, and
the second core comprise a second metal.

8. The tower lift of claim 1, further comprising a controller configured to control a current direction of the first coil and a current direction of the second coil.

9. The tower lift of claim 8, wherein
a direction of a magnetic field formed by the first magnet is same as a direction of a magnetic field formed by the second magnet, and
a direction of a current flowing in the first coil is same as a direction of a current flowing in the second coil.

10. The tower lift of claim 8, wherein
a direction of a magnetic field formed by the first magnet is different from a direction of a magnetic field formed by the second magnet, and
a direction of a current flowing in the first coil is opposite to a direction of a current flowing in the second coil.

11. The tower lift of claim 1, wherein
the first coil and the first magnet are separated from each other in a horizontal direction, and
the second coil and the second magnet are separated from each other in the horizontal direction.

12. The tower lift of claim 11, wherein a separation distance between the first magnet and the first coil is same as a separation distance between the second magnet and the second coil.

13. The tower lift of claim 11, wherein
the first magnet and the first coil are separated from each other by about 1 millimeter (mm) to about 5 mm, and
the second magnet and the second coil are separated from each other by about 1 mm to about 5 mm.

14. The tower lift of claim 1, wherein a height of the frame is about 1 meter.

15. A tower lift comprising:
a rail module comprising a frame, a first coil, and a second coil, the frame extending in a vertical direction, and the first coil and the second coil being arranged on the frame; and
a carriage module configured to move vertically along the rail module and comprising a first magnet and a second magnet, the carriage module comprising a plurality of carriages spaced apart from each other in the vertical direction, the plurality of carriages each comprising a seating shelf having a surface perpendicular to the vertical direction and configured to seat an article,
wherein the first coil and the second coil are arranged on a first surface of the frame and protrude from the rail module in a direction toward the carriage module, the first surface facing the carriage module,
the first magnet is located between the first coil and the second coil, and
the second magnet is located between the first magnet and the second coil.

16. The tower lift of claim 15, wherein
the rail module further comprises a third coil, and
the third coil is arranged on the first surface of the frame and located between the first coil and the second coil.

17. The tower lift of claim 16, wherein
the third coil comprises a portion protruding from the rail module in a direction toward the carriage module, and
the portion protruding from the rail module is located between the first magnet and the second magnet.

18. The tower lift of claim 15, wherein
the carriage module further comprises a partition wall, and
the partition wall is located between the first magnet and the second magnet.

19. The tower lift of claim 15, wherein
the carriage module further comprises a wheel, and
the carriage module comes into contact with the frame and moves along the rail module via the wheel.

20. A semiconductor transfer apparatus having a plurality of layers, the semiconductor transfer apparatus comprising:
- a tower lift configured to transport a container between the plurality of layers;
- a container storage arranged on each of the plurality of layers and configured to store the container; and
- a transport rail configured to connect the tower lift to the container storage and transport the container from the tower lift to the container storage,
- wherein the tower lift comprises:
- a rail module comprising a frame, a first coil, and a second coil, the frame extending in a vertical direction, and the first coil and the second coil being arranged on the frame; and
- a carriage module configured to move vertically along the rail module and comprising a carriage, a first magnet, and a second magnet, the carriage being configured to load the container, and the first magnet and the second magnet being arranged on the carriage,
- the first coil and the second coil are arranged on a first surface of the frame, the first surface facing the carriage,
- the first magnet is located between the first coil and the second coil,
- the second magnet is located between the first magnet and the second coil, and
- a separation distance between the first magnet and the first coil is same as a separation distance between the second magnet and the second coil.

* * * * *